(12) United States Patent
Chang et al.

(10) Patent No.: US 8,339,863 B2
(45) Date of Patent: Dec. 25, 2012

(54) OPERATION METHOD OF MEMORY DEVICE

(75) Inventors: Ting-Chang Chang, Kaohsiung (TW);
Te-Chih Chen, Neipu Township (TW);
Fu-Yen Jian, Ziguan Township (TW);
Chia-Sheng Lin, Jiadong Township (TW)

(73) Assignee: Acer Incorporated, Hsichih Taipei Hsien (TW)

( * ) Notice: Subject to any disclaimer, the term of this patent is extended or adjusted under 35 U.S.C. 154(b) by 180 days.

(21) Appl. No.: 12/841,739

(22) Filed: Jul. 22, 2010

(65) Prior Publication Data

US 2011/0103155 A1    May 5, 2011

(30) Foreign Application Priority Data

Oct. 22, 2009  (TW) ............................... 98135739 A

(51) Int. Cl.
*G11C 11/34* (2006.01)
(52) U.S. Cl. .......... 365/185.28; 365/185.18; 365/185.29
(58) Field of Classification Search ............. 365/185.28, 365/185.29, 185.18
See application file for complete search history.

(56) References Cited

U.S. PATENT DOCUMENTS

| | | | |
|---|---|---|---|
| 5,940,325 A * | 8/1999 | Chang et al. ............. | 365/185.28 |
| 6,172,397 B1 | 1/2001 | Oonakado et al. | |
| 6,483,750 B2 * | 11/2002 | Dallabora et al. ....... | 365/185.23 |
| 6,512,703 B2 | 1/2003 | Saku et al. | |
| 6,524,913 B1 | 2/2003 | Lin et al. | |
| 6,639,836 B1 | 10/2003 | Hung et al. | |
| 6,894,924 B2 * | 5/2005 | Choi et al. ............... | 365/185.01 |
| 7,321,145 B2 * | 1/2008 | Yeh et al. ...................... | 257/296 |
| 7,345,920 B2 | 3/2008 | Yeh | |
| 2007/0211541 A1 | 9/2007 | Jung | |

FOREIGN PATENT DOCUMENTS

| | | |
|---|---|---|
| TW | 200830312 | 1/1996 |
| TW | 510048 | 11/2002 |
| TW | 546787 | 8/2003 |
| TW | 591793 | 6/2004 |
| TW | 250528 | 3/2006 |

OTHER PUBLICATIONS

Kahng, D. and Sze, S.M., "A Floating Gate and Its Application" B.S.T.J. Briefs, May 16, 1967, pp. 1288-1295.

(Continued)

*Primary Examiner* — Son Dinh
(74) *Attorney, Agent, or Firm* — Snell & Wilmer L.L.P.

(57) ABSTRACT

One embodiment of the present invention provides an operation method of a memory device. The memory device includes a source, a drain, and a channel region between the source and the drain, a gate dielectric with a charge storage layer on the channel region, and a gate on the gate dielectric, wherein the source, the drain and the channel region are located in a substrate. The operation method includes the following steps: applying a reverse bias between the gate and the drain of the memory device to generate band-to-band hot holes in the substrate near the drain; injecting the band-to-band hot holes to a drain side of the charge storage layer; and performing a program/erase operation upon the memory device. The band-to-band hot holes in the drain side of the charge storage layer are not completely vanished by the program/erase operation.

19 Claims, 7 Drawing Sheets

OTHER PUBLICATIONS

Chen, C. and Ma, T.P., "A New Source-Side Erase Algorithm to Reduce Wordline Disturb Problem in Flash EPROM," IEEE Xplore, Retrieved Apr. 2, 2009 by National Sun Yat Sen University, pp. 321-325.

Zous, N.K., et al., "Edge FN Stress Induced Leakage Current in Tunnel Oxides," IEEE Explore, Retrieved Jun. 18, 2009 by National Sun Yat Sen University, pp. 262-265.

Kumar, P.B., et al., Endurance and Retention Characteristics of SONOS EEPROM's Operated Using BTBT Induced Hot Hole Erase, IEEE 06CH37728 44th Annual International Reliability Physicis Symposium, San Jose, 2006, pp. 699-700.

Wang, Y., et al., "A Novel SONOS Nonvolatile Flash Memory Device Using Substrate Hot-Hole Injection for Write and Gate Tunneling for Erase," Solid-State Electronics 48, 2004, (2031-2034).

Padilla, A., et al., "Enhanced Endurance of Dual-bit SONOS NVM Cells Using the GIDL Read Method," 2008 Symposium on VLSI Technology Digest of Technical Papers pp. 142-143; Downloaded Mar. 20, 2009 by National Sun Yat Sen University from IEEE Xplore.

* cited by examiner

OPERATION METHOD OF MEMORY DEVICE

CROSS REFERENCE TO RELATED APPLICATIONS

This application claims the right of priority based on Taiwan Patent Application No. 98135739 entitled "OPERATION METHOD OF MEMORY DEVICE" filed on Oct. 22, 2009, which is incorporated herein by reference and assigned to the assignee herein.

FIELD OF THE INVENTION

The present invention relates to an operation method of a memory device, and more particularly to an operation method used to enhance the interpretation about the status of the memory device.

BACKGROUND OF THE INVENTION

Polysilicon thin-film transistors (poly-Si TFTs) have attracted much attention for use in active-matrix liquid-crystal displays (LCDs) since they can be integrated with peripheral driving circuits because of their high effect mobility and driving current. In order to simplify process complexity and lower cost, previous studies have proposed a system-on-panel (SOP) display technology with high-performance poly-Si TFTs designed as functional devices on an LCD panel as controller and memory. SOP technology is primarily focused on portable electronics; thus, low power consumption is required to ensure long battery life. As is well known, non-volatile memory is widely utilized for data storage in various portable electronics due to its advantages of low power consumption and nonvolatility.

According to the basic operation principle of memory device, a gate read voltage $V_{read}$ between the threshold voltages of program operation and erase operation is applied to the gate in order to measure the corresponding current and identify the status "0" or "1" of the memory device. However, several studies have reported that a high gate-induced drain leakage (GIDL) current could cause misidentification of that status in silicon-oxide-nitride-oxide-silicon (SONOS) memory device because some carriers generated from GIDL would flow to a Si substrate and result in threshold voltage disturbance (Vt disturbance) and the large GIDL current would cause read error in memory array. Therefore, for SONOS TFTs, this problem will be more serious due to the significant trap-assisted GIDL current. In addition, the leakage current also causes high power consumption.

The conventional structure of the lightly-doped drain (LDD) can be used to reduce the effect caused by the leakage current. However, the production cost is increased due to the additional processing step. Therefore, a method used to enhance the interpretation about the status of the memory device without increasing the additional production cost is needed.

SUMMARY OF THE INVENTION

The present invention is directed to provide a method for enhancing the interpretation about the status of the memory device.

The present invention is also directed to provide an operation method of a memory device. According to the method, the read leakage current of the memory device is suppressed permanently by means of a single electrical operation so that power consumption is reduced and signal misidentification is prevented.

The present invention is also directed to provide an operation method of a memory device compatible to electrical operation method of general memory devices without increasing any additional fabrication process.

In order to achieve the said objectives or other objectives, one embodiment of the present invention provides an operation method of a memory device. The memory device has a source, a drain, a channel region located between the source and the drain, a gate dielectric having a charge storage layer and being located on the channel region, and a gate located on the gate dielectric. The source, the drain and the channel region are located in a substrate. The operation method includes the following steps. First, a reverse bias is applied between the gate and the drain of the memory device such that a plurality of band-to-band hot holes are generated in the substrate near the drain and the band-to-band hot holes are injected into a drain side of the charge storage layer of the memory device. Next, a program/erase operation is performed upon the memory device. The band-to-band hot holes located in the drain side of the charge storage layer are not completely vanished by the Fowler-Nordheim (FN) program/erase operation.

Another embodiment of the present invention provides an operation method of a memory device. The memory device has a source, a drain, a channel region located between the source and the drain, a first insulating layer located on the channel region, a charge storage layer located on the first insulating layer, a second insulating layer located on the charge storage layer, and a gate located on the second insulating layer. The source, the drain and the channel region are located in a substrate. The operation method includes the following steps. First, a negative voltage and a positive voltage are applied to the gate and the drain of the memory device, respectively, such that a plurality of band-to-band hot holes are generated in the substrate near the drain and the band-to-band hot holes are injected into a drain side of the charge storage layer of the memory device. Next, a program operation and an erase operation are repeatedly performed upon the memory device by means of FN tunneling mechanism. After the program operation and the erase operation are repeatedly performed, at least part of the band-to-band hot holes is still retained in the drain side of the charge storage layer to suppress the GIDL current.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute part of this specification. The drawings illustrate embodiments of the invention and, together with the description, serve to explain the principles of the invention.

DETAILED DESCRIPTION OF THE INVENTION

Figure 1:
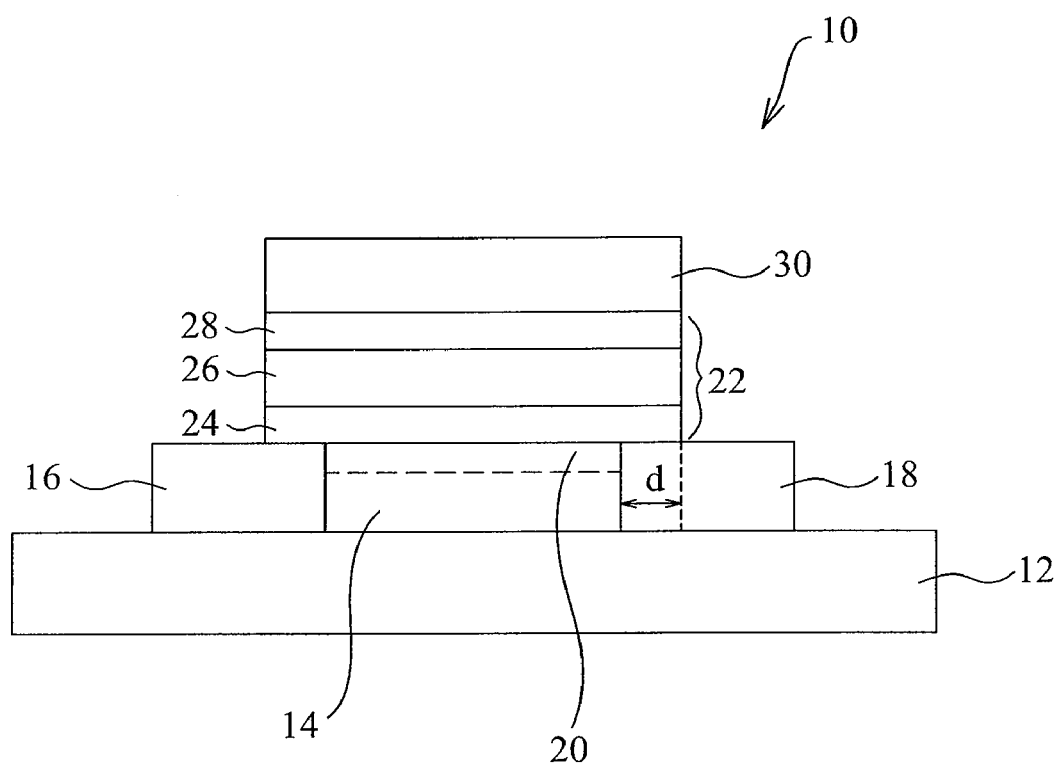
FIG. 1 is a schematic cross-sectional view of an n-channel SONOS memory device.

The embodiments of the present invention will now be described in greater detail as follows by referring to the drawings that accompany the present application. The like reference characters represent like elements or elements having the same function. It should be noted that the features illustrated in the drawings are not necessarily drawn to scale and the drawings merely show the structural characteristics of the present invention. In the following description, "an element is located on another element" represents "an element is located directly on another element" or "an element is located indirectly on another element" except explicit demonstration.

FIG. 1 is a schematic cross-sectional view of an n-channel SONOS memory device 10. The fabrication process of the n-channel SONOS memory device 10 is described in detail as follows. First, a glass carrying board 12 is provided. Next, a silicon oxide buffer layer (not shown) and a 50-nm-thick undoped amorphous-Si thin-film are deposited sequentially on the glass carrying board 12. Next, a dehydrogenation is performed through furnace annealing process. Afterwards, a poly-Si layer 14 is formed from the amorphous-Si thin-film by means of 308-nm XeCl excimer laser with line-shaped beam power of 350 mJ/cm$^2$. The poly-Si layer 14 is regarded as a substrate. An active region is patterned in the poly-Si substrate 14 by means of plasma dry etching, for example. The source 16, the drain 18, and the channel region 20 located between the source 16 and the drain 18 are defined in the poly-Si substrate 14 by means of a mask. The source 16 and the drain 18 are doped with n-type dopants by ion implantation technique.

Next, a multilayer gate dielectric 22 is formed on the channel region 20 of the poly-Si substrate 14. Generally speaking, the multiplayer gate dielectric 22 may include a first insulating layer 24 located on the channel region 20, a charge storage layer 26 located on the first insulating layer 24, and a second insulating layer 28 located on the charge storage layer 26. Because the charge storage layer 26 is located between the first insulating layer 24 and the second insulating layer 28, the charge storage layer 26 may be used to store electric charges. The multilayer gate dielectric 22 of the present embodiment is an oxide-nitride-oxide (ONO) structure including 10-nm-thick bottom oxide layer (the first insulating layer 24), 20-nm-thick silicon nitride layer (the charge storage layer 26), and 40-nm-thick top oxide layer (the second insulating layer 28). Next, MoW is sputtered and patterned to form the gate 30 located on the second insulating layer 28 of the gate dielectric 22. The SONOS memory device 10 is 6 μm long and 30 μm wide. The length d of the overlap region where the source 16 overlaps the gate dielectric 22 and the length d of the overlap region where the drain 18 overlaps the gate dielectric 22 are 0.75 μm, respectively. The memory device 10 does not include a lightly-doped drain located in the channel region 20 of the poly-Si substrate 14 near the drain 18. In the present embodiment, the charge storage layer 26 is composed of silicon nitride; however in another embodiment, the charge storage layer 26 may be composed of aluminum oxide, tantalum oxide, titanium oxide or other equivalent material for charge storage.

Figure 2A:
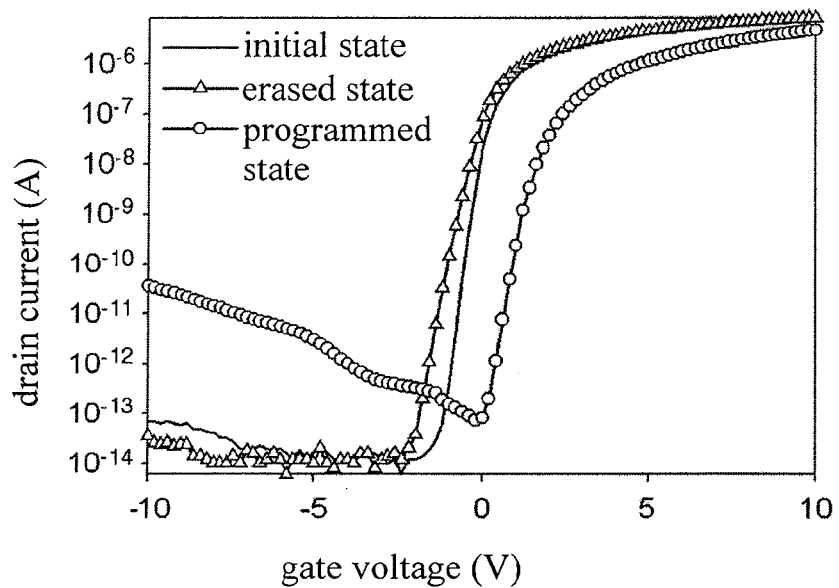
FIG. 2A shows the drain current versus the gate voltage characteristics of the n-channel SONOS memory device in different states.
Figure 2B:
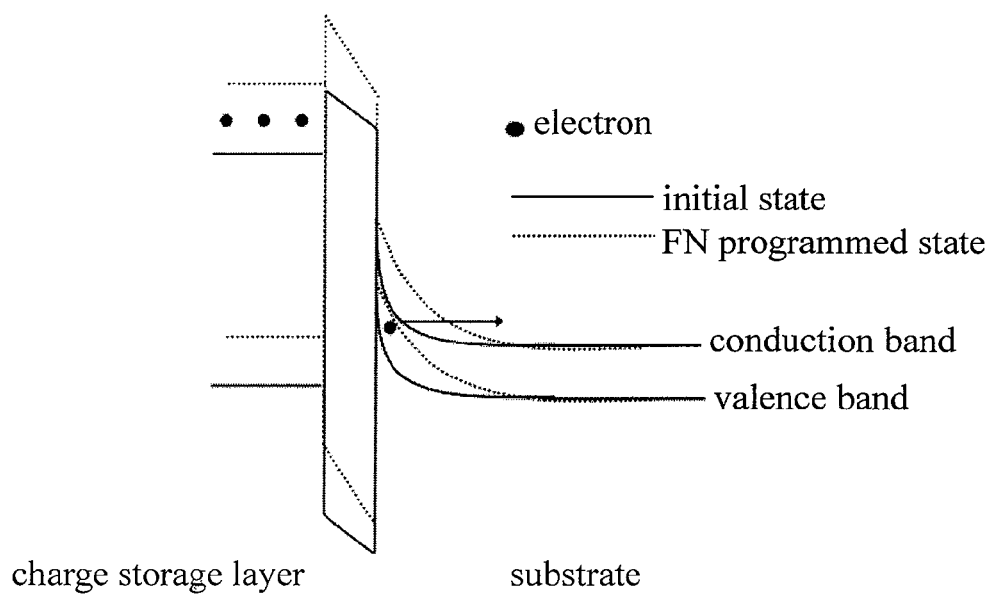
FIG. 2B is an energy band diagram showing the principle of GIDL.

FIG. 2A shows the drain current versus the gate voltage characteristics of the n-channel SONOS memory device 10 in an initial state, a programmed state and an erased state. The initial state is a state prior to the programmed state. In the present embodiment, the program/erase operation of the SONOS memory device 10 is performed by means of FN tunneling mechanism. The erase operation of the SONOS memory device 10 is performed by means of applying −40 volts to the gate 30 for 2 seconds. The program operation of the SONOS memory device 10 is performed by means of applying 40 volts to the gate 30 for 0.05 seconds. When the program/erase operation is performed by means FN tunneling mechanism, the source 16 and the drain 18 are grounded. Referring to FIG. 2A, drain current of the SONOS memory device 10 may be measured on the condition that gate voltage is swept from −10 volts to 10 volts and drain voltage is set to 0.1 volts. All measurements are performed at 30-° C. environment. FIG. 2B is an energy band diagram showing the principle of GIDL.

Generally speaking, under the off-state operation in which a positive bias is applied to the drain 18 and a negative bias is applied to the gate 30, the trap-assisted GIDL is the main mechanism for the leakage current of the SONOS memory device 10.

Figure 2C:
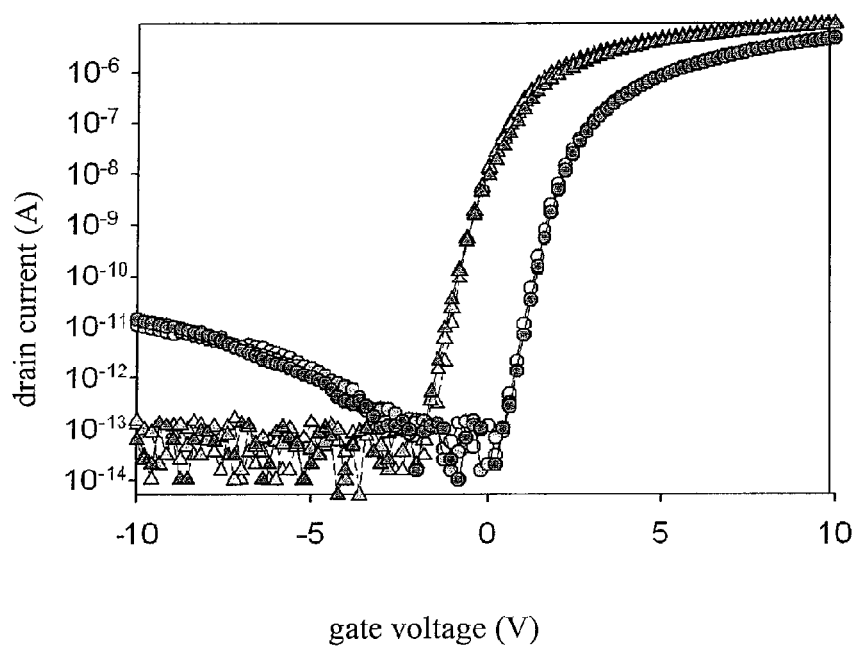
FIG. 2C shows the drain current versus the gate voltage characteristics of the n-channel SONOS memory device after the repeated FN program/erase operations are performed thereon.

Referring to FIGS. 2A and 2B, after FN electron program operation is performed on the SONOS memory device 10, because there exists a larger electric field in the overlap region where the gate 30 overlaps the drain 18, electrons are injected into the charge storage layer 26 on the mentioned overlap region and an additional bias is generated on the drain 18 to make the energy band bending upwardly, such that electrons can tunnel into a conduction band from a valence band of the drain area. Therefore, the GIDL current is generated greatly such that the drain current increases obviously. As far as the erased state is concerned, a small amount of holes trapped in the charge storage layer 26 can suppress the energy band bending, and therefore, the leakage current decreases after the erase operation is performed. FIG. 2C shows the drain current versus the gate voltage characteristics of the n-channel SONOS memory device 10 after the repeated FN program/erase operations are performed thereon. Referring to FIG. 2C, after the repeated program/erase operations are performed, the phenomenon of the trap-assisted GIDL appears repeatedly in the programmed state but not appears in the erased state.

According to the basic operation principle of nonvolatile memory devices, the noticeable leakage current contributed by the electrons trapped in the charge storage layer 26 will possibly lead to problems such as more power consumption and serious signal misidentification. In addition, because the memory devices are usually connected and used in the way of memory cell array, power consumption and signal misidentification will be more serious.

To solve the above-mentioned problems, one embodiment of the present invention provides an operation method of a memory device for enhancing the interpretation about the status of the memory device. The memory device is a nonvolatile memory device and the above-mentioned n-channel SONGS memory device 10 is used to explain the operation method.

Figure 3A:
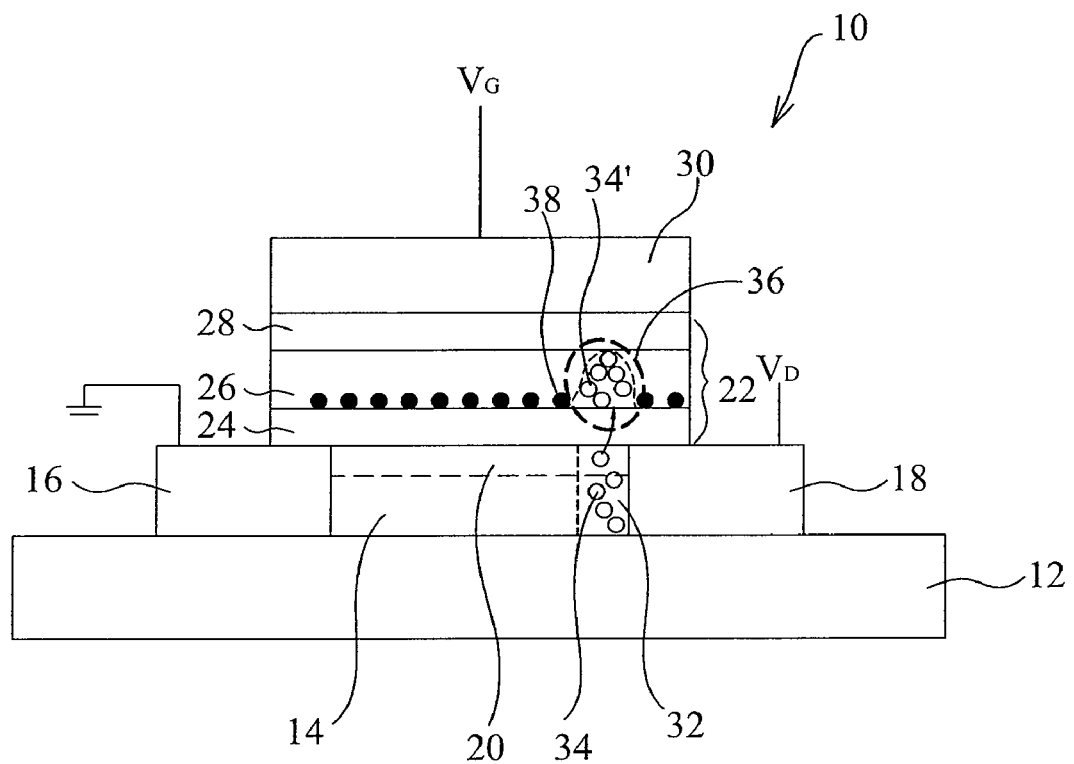
FIG. 3A is a schematic view showing phenomenon of hot hole injection of an embodiment of the present invention.

FIG. 3A is a schematic view showing phenomenon of hot hole injection of an embodiment of the present invention. The operation method of the memory device of the present embodiment includes the following steps. First, a reverse bias is applied between the gate 30 and the drain 18 of the memory device 10. For example, a negative gate voltage $V_G$ and a positive drain voltage $V_D$ are applied to the gate 30 and the drain 18 of the memory device 10, respectively, such that band-to-band hot holes 34 are generated in a depletion region 32 of the substrate 14 near the drain 18 and then injected into a drain side 36 of the charge storage layer 26 of the memory device 10. In the operation of the band-to-band hot holes of the present embodiment, the gate voltage $V_G$ is −25 volts, the drain voltage $V_D$ is 10 volts, the source 16 is grounded, and processing time is 0.1 seconds. Accordingly, electrons can tunnel into a conduction band from a valence band of the drain area to generate electron-hole pairs. The holes are accelerated through the electric field in the depletion region 32 near the drain 18 and then injected into the charge storage layer 26.

Next, a program/erase operation is performed upon the memory device 10. Generally speaking, the program/erase operation may be performed upon the memory device by means of Fowler-Nordheim (FN) tunneling mechanism, band-to-band tunneling mechanism or other ways. For example, the program/erase operation is usually performed on a NAND memory by means of FN tunneling mechanism. The SONOS memory device 10 of the present embodiment may be a cell of the NAND-type frame.

Figure 3B:
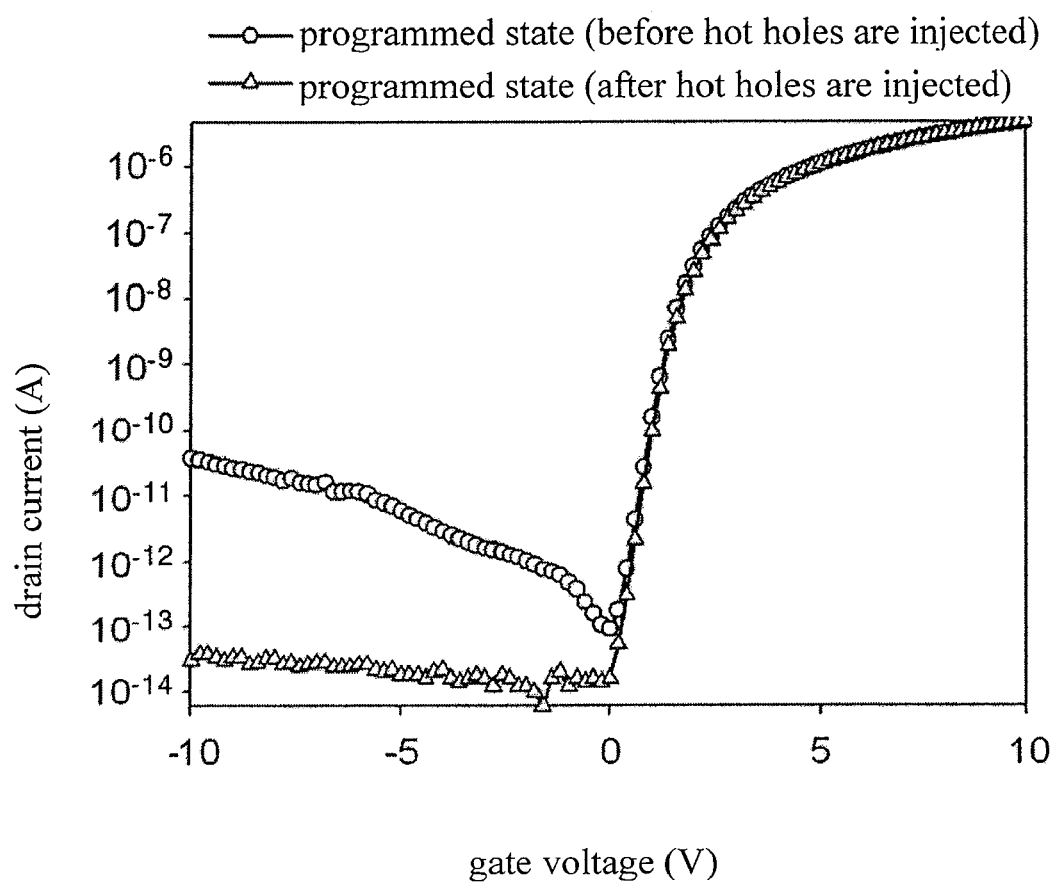
FIG. 3B shows the drain current versus the gate voltage characteristics of the SONOS memory device in a programmed state before and after band-to-band hot hole injection.
Figure 3C:
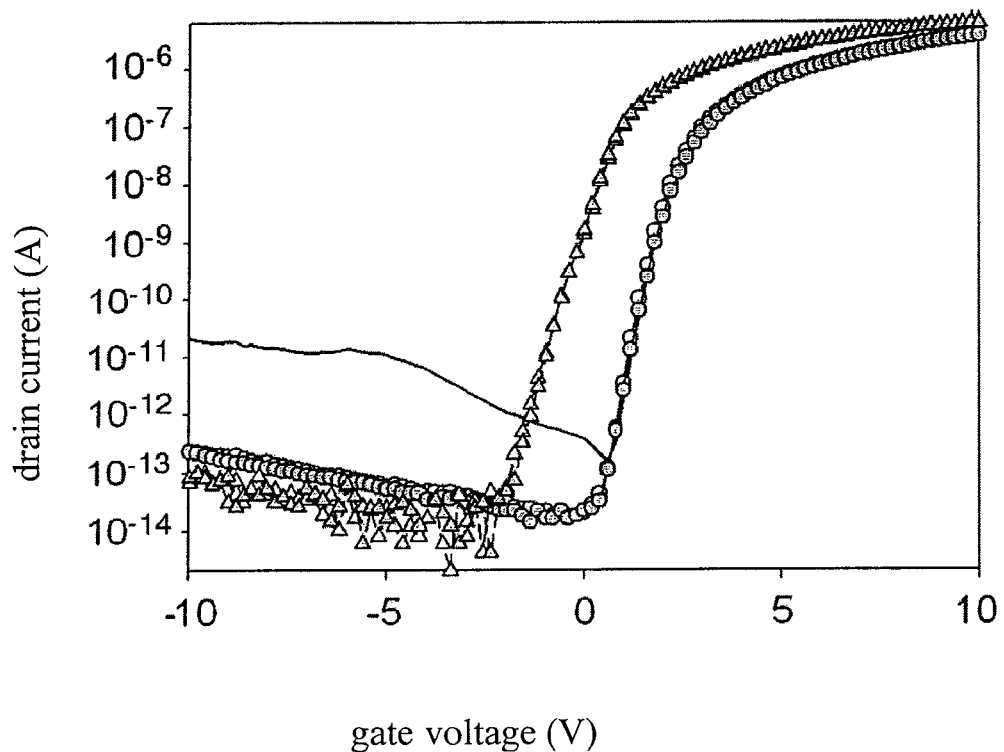
FIG. 3C shows the drain current versus the gate voltage characteristics of the SONOS memory device after hot hole injection operation and then a plurality of the FN program/erase operations are performed.

FIG. 3B shows the drain current versus the gate voltage characteristics of the SONOS memory device 10 in a programmed state before and after band-to-band hot hole injection. As shown in FIG. 3B, in the present embodiment, by means of band-to-band hot hole injection operation, the leakage current caused by the electrons injected into the drain side 36 during the program operation can be suppressed when the SONOS memory device 10 is read. FIG. 3C shows the drain current versus the gate voltage characteristics of the SONOS memory device 10 after hot hole injection operation and then a plurality of the FN program/erase operations are performed. Referring to FIG. 3C, the leakage current is continuously suppressed after hot hole injection operation is performed once because the positions of the hot holes 34' in the charge storage layer 26 are not completely consistent with the positions of the FN programmed electrons 38 such that the hot holes 34' do not entirely recombine with the FN programmed electrons 38. That is, band-to-band hot holes 34' located in the drain side 36 of the charge storage layer 26 are not vanished by the repeated FN program/erase operations, as shown in FIG. 3A. Because at least part of the band-to-band hot holes 34' is still retained in the drain side 36 of the charge storage layer 26 after the program/erase operations are repeatedly performed, the GIDL current can therefore be suppressed.

Figure 4:
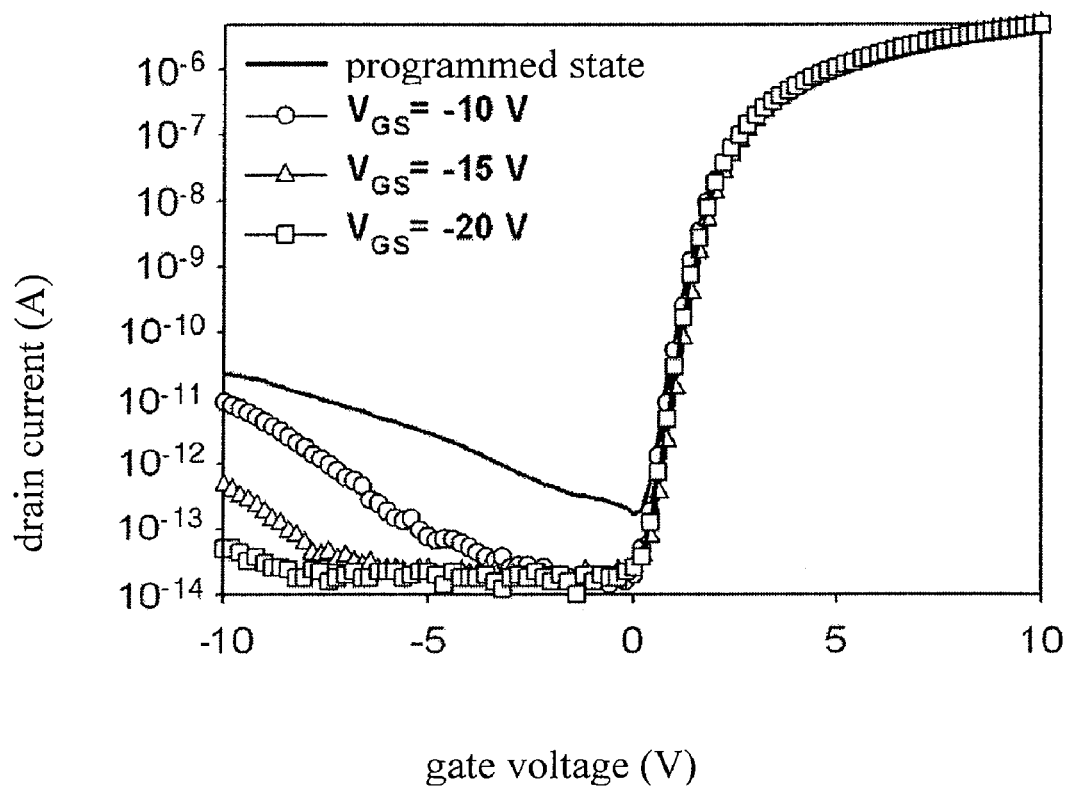
FIG. 4 shows the drain current versus the gate voltage characteristics of the SONOS memory device after hot holes are injected under different gate-to-source voltages.

The influence of the stress voltage of the band-to-band hot hole operation on the suppressed leakage current is described below. FIG. 4 shows the drain current versus the gate voltage characteristics of the SONOS memory device 10 after hot holes are injected under different gate-to-source voltages $V_{GS}$. The electrical operation of the band-to-band hot hole injection is performed under the conditions that: the gate-to-source voltages $V_{GS}$ are −10 volts, −15 volts, and −20 volts respectively while the drain-to-source voltage $V_{DS}$ is fixed at 5 volts and the source 16 is grounded. As shown in FIG. 4, when the absolute value of the negative gate voltage increases, at the overlap region where the gate 30 overlaps the drain 18, the vertical electric field becomes larger and the energy band bends more, and therefore, more holes 34 are generated and injected into the charge storage layer 26, such that the leakage current becomes lower. As shown in FIG. 4, in the embodiment of the present invention, by means of the band-to-band hot hole injection, the high electric field caused by the programmed electrons in the overlap region where the gate 30 overlaps the drain 18 is reduced and the trap-assisted GIDL current is reduced. The experimental results clearly show that the suppression of the leakage current depends on the band-to-band hot holes 34 resulting from the vertical electric field. The larger the vertical electric field becomes, the more hot holes 34' are injected into the drain side 36 and the greater the suppression is. Because the injected hot holes 34' are spread throughout the depth of the entire charge storage layer 26, the effect of suppressing the leakage current is sustained even after 100 iterative FN program/erase operations.

In the embodiment of the present invention, the leakage current caused by electrons programmed into the drain side of the charge storage layer is effectively and permanently suppressed by performing the band-to-band hot hole injection operation one time only, whereby signal misidentification is prevented and power consumption is reduced. In addition, the operation method of the memory device provided in the embodiment of the present invention is compatible to operation method of a general memory device such as a flash memory, and therefore, the operation method of the memory device provided in the embodiment of the present invention can be directly applied to a present flash memory industry without increasing any additional fabrication process.

In the present invention, the type of the memory device of the embodiment is not limited and the parameters of the experiments of the embodiment are not restricted.

In other words, the operation method of the memory device provided in the present invention is also applied to a p-channel memory device, and the substantial structure or material composition of the memory device can be changed. The operation method of the memory device is compatible to other program/erase operation mechanism. In addition, in practice, the parameters and conditions for the operation method of the memory device provided in the present invention can be changed according to a diversity of types, structures or materials of memory devices. The scope of the present invention is not limited herein.

Although the invention illustrated herein is embodied in above examples, it is not intended to limit the invention. The structural changes and modifications belong to the protective scope without departing from the aim and the scope of the invention. The scope of claims as defined in the present invention can refer to the following claims.

The invention claimed is:

1. An operation method of a memory device, the memory device having a source, a drain, a channel region located between the source and the drain, a gate dielectric having a charge storage layer and being located on the channel region, and a gate located on the gate dielectric, and the source, the drain and the channel. region are located in a substrate, the operation method comprising:
applying a reverse bias between the gate and the drain of the memory device in order to generate band-to-band hot holes in the substrate near the drain, and injecting the band-to-band hot holes into a drain side of the charge storage layer of the memory device; and
performing a program/erase operation upon the memory device by means of tunneling mechanism different from the band-to-band hot holes injection mechanism after the band-to-band hot holes are injected:
wherein the band-to-band hot holes located in the drain side of the charge storage layer are not completely vanished by the program/erase operation.

2. The operation method of the memory device as claimed in claim 1, wherein after the program erase, operation is performed upon the memory device, at least part of the band-to-band hot holes is still retained in the drain side of the charge storage layer in order to suppress gate-induced drain leakage current.

3. The operation method of the memory device as claimed in claim 1, wherein the step of applying the reverse bias between the gate and the drain of the memory device comprises:
applying a negative voltage to the gate of the memory device; and
applying a positive voltage to the drain of the memory device.

4. The operation method of the memory device as claimed in claim 3, wherein the step of applying the reverse bias between the gate and the drain of the memory device further comprises:
grounding the source of the memory device, 5. The operation method of the memory device as claimed in claim 1, wherein the program/erase operation is performed by means of Fowler-Nordheim tunneling mechanism.

6. The operation method of the memory device as claimed in claim 1, wherein the program/erase operation comprises a program operation, and the program operation comprises injecting electrons into the charge storage layer of the memory device.

7. The operation method of the memory device as claimed in claim 1, wherein the memory device is a nonvolatile memory device.

8. The operation method of the memory device as claimed in claim 1, wherein the gate dielectric further comprises a first insulating layer and a second insulating layer, the first insulating layer is located between the charge storage layer and the channel region, and the second insulating layer is located between the charge storage layer and the gate.

9. The operation method of the memory device as claimed in claim 8, wherein the gate dielectric is an oxide-nitride-oxide structure.

10. The operation method of the memory device as claimed in claim 1, wherein the memory device is an n-channel device.

11. The operation method of the memory device as claimed in claim 1, wherein the memory device is a cell of the NAND-type frame.

12. The operation method of the memory device as claimed in claim 1, wherein the memory device does not comprise a lightly-doped drain located in the channel region near the drain, 13. The operation method of the memory device as claimed in claim 1, wherein the charge storage layer of the memory device is a silicon nitride layer, an aluminum oxide layer, a tantalum oxide layer or a titanium oxide layer, 14. An operation method of a memory device, the memory device having a source, a drain, a channel region located between the source and the drain, a first insulating layer located on the channel region, a charge storage layer located on the first insulating layer, a second insulating layer located on the charge storage layer, and a gate located on the second insulating layer, and the source, the drain and the channel region are located in a substrate, the operation method comprising:
applying a negative voltage and a positive voltage to the gate and the drain of the memory device, respectively, such that a plurality of band-to-band hot holes are generated in the substrate near the drain and the band-to-band hot holes are injected into a drain side of the charge storage layer of the memory device; and
repeatedly performing a program operation and an erase operation upon the memory device by means of Fowler-Nordheim tunneling mechanism after the band-to-band hot holes are injected;
wherein after the program operation and the erase operation are repeatedly performed upon the memory device, at least part of the band-to-band hot holes is still retained in the drain side of the charge storage layer in order to suppress the gate-induced drain leakage current, 15. The operation method of the memory device as claimed in claim 14, wherein in the step of applying the negative voltage and the positive voltage to the gate and the drain of the memory device, respectively, such that the band-to-band hot holes are generated in the substrate near the drain, the source of the memory device is grounded.

16. The operation method of the memory device as claimed in claim 14, wherein the program operation is performed by means of injecting electrons into the charge storage layer of the memory device, 17. The operation method of the memory device as claimed in claim 14, wherein the memory device is a nonvolatile memory device.

18. The operation method of the memory device as claimed in claim 17, wherein the memory device is an n-channel silicon-oxide-nitride-oxide-silicon device.

19. The operation method of the memory device as claimed in claim 14, wherein the memory device does not comprise a lightly-doped drain located in the channel region near the drain.

* * * * *